(12) United States Patent
Melanson

(10) Patent No.: US 11,764,741 B1
(45) Date of Patent: Sep. 19, 2023

(54) DETERMINATION OF GAIN OF PULSE WIDTH MODULATION AMPLIFIER SYSTEM

(71) Applicant: Cirrus Logic International Semiconductor Ltd., Edinburgh (GB)

(72) Inventor: John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 36 days.

(21) Appl. No.: 17/720,936

(22) Filed: Apr. 14, 2022

Related U.S. Application Data

(60) Provisional application No. 63/277,339, filed on Nov. 9, 2021.

(51) Int. Cl.
*H03F 3/217* (2006.01)
*H03F 1/02* (2006.01)

(52) U.S. Cl.
CPC ......... *H03F 3/217* (2013.01); *H03F 2200/03* (2013.01); *H03F 2200/375* (2013.01)

(58) Field of Classification Search
CPC . H03F 3/217; H03F 2200/03; H03F 2200/375
USPC ........................................ 330/10, 251, 207 A
See application file for complete search history.

(56) References Cited

U.S. PATENT DOCUMENTS

| | | | | |
|---|---|---|---|---|
| 10,236,827 | B2 * | 3/2019 | Zhu | H03F 1/3264 |
| 2012/0274399 | A1 | 11/2012 | Seedher et al. | |
| 2013/0187710 | A1 | 7/2013 | Nagashima | |
| 2014/0022102 | A1 | 1/2014 | Cho et al. | |
| 2015/0028789 | A1 | 1/2015 | Uchida | |
| 2018/0212569 | A1 | 7/2018 | Zhu et al. | |
| 2020/0343871 | A1 | 10/2020 | Gaboriau et al. | |

FOREIGN PATENT DOCUMENTS

| | | |
|---|---|---|
| JP | 4274204 B2 | 6/2009 |
| JP | 2012231264 A | 11/2012 |
| WO | 2016003597 A2 | 1/2016 |

OTHER PUBLICATIONS

International Search Report and Written Opinion of the International Searching Authority, International Application No. PCT/US2023/017272, dated Jun. 19, 2023.
International Search Report and Written Opinion of the International Searching Authority, International Application No. PCT/US2023/017411, dated Jun. 28, 2023.

(Continued)

*Primary Examiner* — Hieu P Nguyen
(74) *Attorney, Agent, or Firm* — Jackson Walker L.L.P

(57) ABSTRACT

A switched mode amplifier system may include a switched mode amplifier having an amplifier input coupled to an output of an analog integrator and an amplifier output, include a feedback network coupled between the amplifier output and an input of the analog integrator, and a calibration system. The calibration system may be configured to force the input of the analog integrator to a fixed known input value, force the amplifier output to a fixed known duty cycle, measure an analog signal generated at the output of the analog integrator in response to forcing the input of the analog integrator to the fixed value, determine an offset of the switched mode amplifier system based on the analog signal, and correct for the offset.

15 Claims, 5 Drawing Sheets

(56) References Cited

OTHER PUBLICATIONS

International Search Report and Written Opinion of the International Searching Authority, International Application No. PCT/US2023/017852, dated Jun. 28, 2023.
Anonymous, "Slew Rate: What is it? (Formula, Units & Flow to Measure It) | Electrical4U", Apr. 12, 2021, pp. 1-15, retrieved from the Internet: URL:https://www.electrical4u.com/slew-rate/ (retrieved on Jun. 19, 2023).

* cited by examiner

DETERMINATION OF GAIN OF PULSE WIDTH MODULATION AMPLIFIER SYSTEM

FIELD OF DISCLOSURE

The present disclosure relates in general to circuits for audio devices, including without limitation personal audio devices, such as wireless telephones and media players, and more specifically, to systems and methods for calibrating a pulse width modulation amplifier system.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation (PDM), or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

In amplifier systems including those having class-D amplifiers, it may be critical to determine and correct for any signal offsets that may exist in the amplifier path. For example, some examples of signal offsets may be offsets inherent in integrator stages of a preamplifier stage of the amplifier system, or mismatch of resistors used to set a gain of the amplifier system. Without correction of such signal offsets, signal distortion, signal inaccuracy, and/or other undesirable conditions may persist.

SUMMARY

In accordance with the teachings of the present disclosure, one or more disadvantages and problems associated with existing approaches to minimizing offset in a pulse width modulation amplifier system may be reduced or eliminated.

In accordance with embodiments of the present disclosure, a switched mode amplifier system may include a switched mode amplifier having an amplifier input coupled to an output of an analog integrator and an amplifier output, include a feedback network coupled between the amplifier output and an input of the analog integrator, include a loop filter configured to generate a digital loop filter output, include a quantizer configured to generate a pulse-width modulated representation of the digital loop filter output; and include a calibration system. The calibration system may be configured to force the input of the analog integrator to a fixed known input value, low-pass filter the pulse-width modulated representation of the digital loop filter output generated by the quantizer to generate a filtered quantizer output signal, determine an offset of the switched mode amplifier system based on the filtered quantizer output signal, and correct for the offset.

In accordance with these and other embodiments of the present disclosure, a method may be provided for use in a switched mode amplifier system having a switched mode amplifier including an amplifier input coupled to an output of an analog integrator and an amplifier output, having a feedback network coupled between the amplifier output and an input of the analog integrator, having a loop filter configured to generate a digital loop filter output, and having a quantizer configured to generate a pulse-width modulated representation of the digital loop filter output. The method may include forcing the input of the analog integrator to a fixed known input value, low-pass filtering the pulse-width modulated representation of the digital loop filter output generated by the quantizer to generate a filtered quantizer output signal, and determining an offset of the switched mode amplifier system based on the filtered quantizer output signal, and correcting for the offset.

In accordance with these and other embodiments of the present disclosure, a calibration system may be provided for use with a switched mode amplifier system having a switched mode amplifier including an amplifier input coupled to an output of an analog integrator and an amplifier output, having a feedback network coupled between the amplifier output and an input of the analog integrator, having a loop filter configured to generate a digital loop filter output, and having a quantizer configured to generate a pulse-width modulated representation of the digital loop filter output. The calibration system may configured to force the input of the analog integrator to a fixed known input value, low-pass filter the pulse-width modulated representation of the digital loop filter output generated by the quantizer to generate a filtered quantizer output signal, determine an offset of the switched mode amplifier system based on the filtered quantizer output signal, and correct for the offset.

In accordance with these and other embodiments of the present disclosure, a switched mode amplifier system may include a switched mode amplifier having an amplifier input coupled to an output of an analog integrator and an amplifier output and including a calibration system. The calibration system may be configured to force the input of the analog integrator to a fixed known input value, force the amplifier output to a fixed known duty cycle, measure an analog signal generated at the output of the analog integrator in response to forcing the input of the analog integrator to the fixed value, determine an offset of the switched mode amplifier system based on the analog signal, and correct for the offset.

In accordance with these and other embodiments of the present disclosure, a method may be provided for use in a switched mode amplifier system having a switched mode amplifier including an amplifier input coupled to an output of an analog integrator and an amplifier output. The method may include forcing the input of the analog integrator to a fixed known input value, forcing the amplifier output to a fixed known duty cycle, measuring an analog signal generated at the output of the analog integrator in response to forcing the input of the analog integrator to the fixed value, determining an offset of the switched mode amplifier system based on the analog signal, and correcting for the offset.

In accordance with these and other embodiments of the present disclosure, a calibration system may be provided for use with a switched mode amplifier system having a switched mode amplifier including an amplifier input coupled to an output of an analog integrator and an amplifier output. The calibration system may force the input of the analog integrator to a fixed known input value, force the amplifier output to a fixed known duty cycle, measure an analog signal generated at the output of the analog integrator in response to forcing the input of the analog integrator to the fixed value, determine an offset of the switched mode amplifier system based on the analog signal, and correct for the offset.

In accordance with these and other embodiments of the present disclosure, a switched mode amplifier system may include a switched mode amplifier comprising having an amplifier input coupled to an output of an analog integrator and an amplifier output and including a calibration system configured to force the input of the analog integrator to a fixed known input value, determine a slew rate of an analog signal generated at the output of the analog integrator in response to forcing the input of the analog integrator to the fixed value, and determine an integrator gain of the switched mode amplifier system based on the slew rate.

In accordance with these and other embodiments of the present disclosure, a method may be provided for use in a switched mode amplifier system having a switched mode amplifier including an amplifier input coupled to an output of an analog integrator and an amplifier output. The method may include forcing the input of the analog integrator to a fixed known input value, determining a slew rate of an analog signal generated at the output of the analog integrator in response to forcing the input of the analog integrator to the fixed value, and determining an integrator gain of the switched mode amplifier system based on the slew rate.

In accordance with these and other embodiments of the present disclosure, a calibration system may be provided for use with a switched mode amplifier system having a switched mode amplifier including an amplifier input coupled to an output of an analog integrator and an amplifier output. The calibration system may be configured to force the input of the analog integrator to a fixed known input value, determine a slew rate of an analog signal generated at the output of the analog integrator in response to forcing the input of the analog integrator to the fixed value, and determine an integrator gain of the switched mode amplifier system based on the slew rate.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
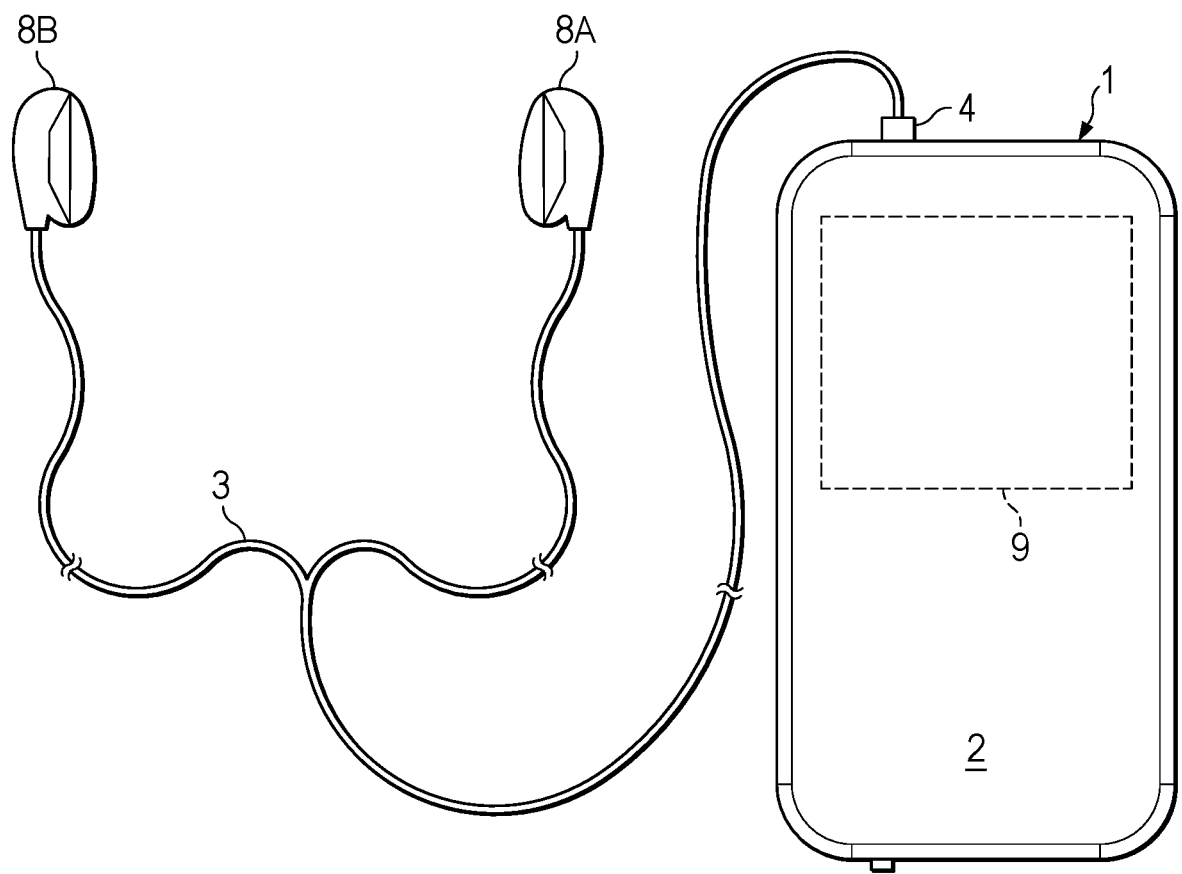
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
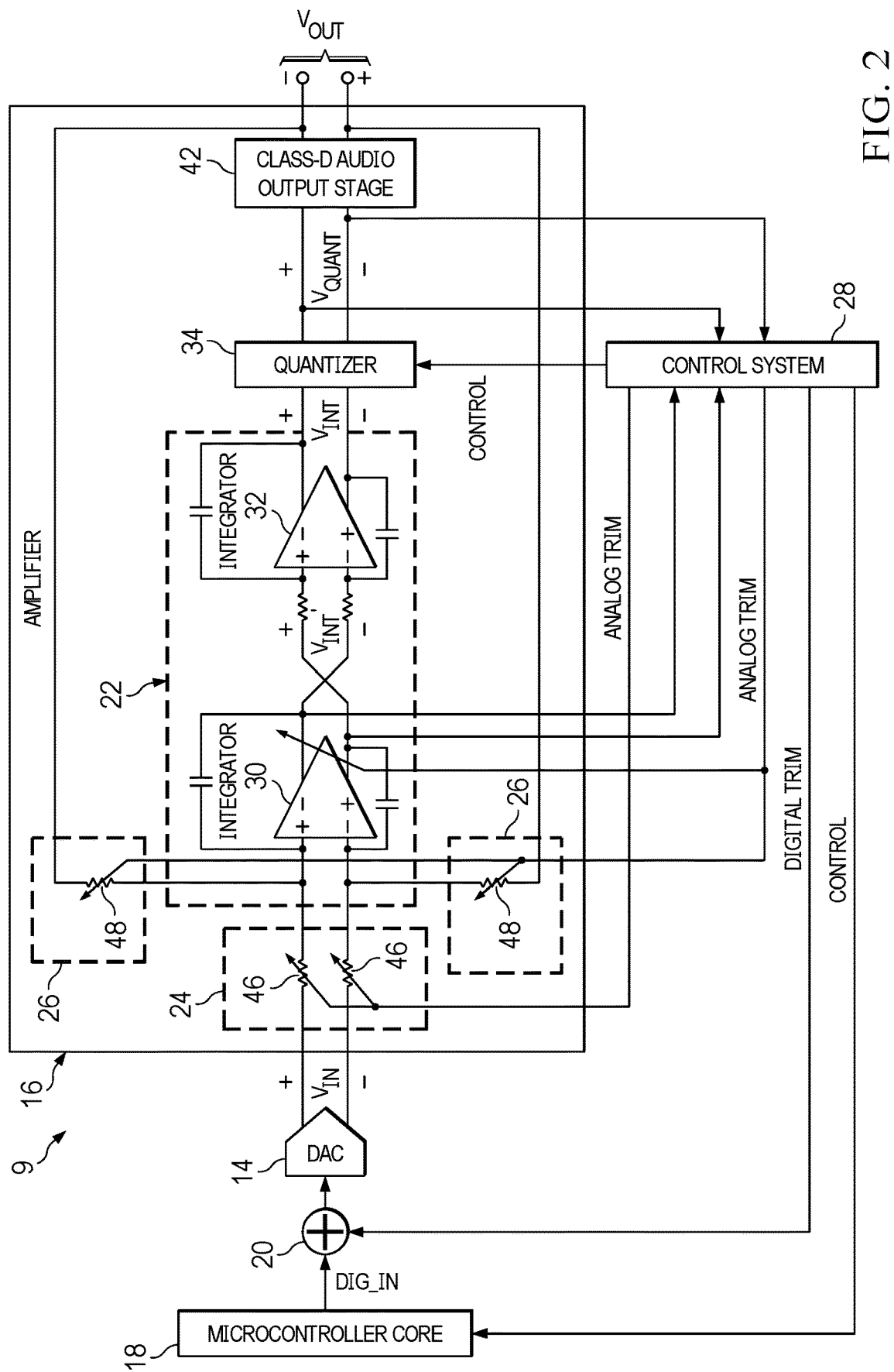
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$. DAC 14 may supply analog input signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

As also shown in FIG. 2, amplifier 16 may include a signal input network 24, a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a quantizer 34, a final output stage comprising a class-D audio output stage 42 configured to generate audio output signal $V_{OUT}$ at an amplifier output of amplifier 16 as a function of quantized intermediate signal $V_{INT}$, a signal feedback network 26 coupled between the amplifier output and the amplifier input, and a control system 28 for controlling the operation of certain components of amplifier 16, as described in greater detail below.

Signal input network 24 may include any suitable input network receiving the amplifier input of amplifier 16. For example, as shown in FIG. 2, signal input network 24 may include variable input resistors 46, wherein resistances of variable input resistors 46 may be controlled by control signals received from control system 28, as described in greater detail below.

First stage 22 may include any suitable analog front end circuit for conditioning analog input signal $V_{IN}$ for use by class-D audio output stage 42. For example, first stage 22 may include one or more analog integrators 30 and 32 cascaded in series, as shown in FIG. 2.

Quantizer 34 may comprise any system, device, or apparatus configured to quantize intermediate signal $V_{INT}$ to generate an equivalent digital PWM signal $V_{QUANT}$. Accordingly, quantizer 34 may be referred to as a digital pulse width modulator. As shown in FIG. 2, quantizer 34 may receive one or more control signals from control system 28, which may control operation of quantizer 34 during a calibration phase of audio IC 9, as described in greater detail below.

Class-D audio output stage 42 may comprise any system, device, or apparatus configured to receive the output of quantizer 34 and drive an output signal $V_{OUT}$ which is an amplified version of analog input signal $V_{IN}$. Accordingly, class-D audio output stage 42 may comprise a plurality of output switches configured to generate output signal $V_{OUT}$ from the modulated signal $V_{QUANT}$ generated by quantizer 34. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by class-D audio output stage 42.

Signal feedback network 26 may include any suitable feedback network for feeding back a signal indicative of audio output signal $V_{OUT}$ to the amplifier input of amplifier 16. For example, as shown in FIG. 2, signal feedback network 26 may include variable feedback resistors 48, wherein resistances of variable feedback resistors 48 are controlled by control signals received from control system 28, as described in greater detail below. Those of skill in the art may recognize that a closed loop gain of amplifier 16 may be set by a ratio of the resistances of variable feedback resistors 48 to the resistances of variable input resistors 46.

As also shown in FIG. 2, example audio IC 9 may also include a control system 28. Control system 28 may include any suitable system, device, or apparatus configured to receive information indicative of a signal (e.g., voltage $V_{INT}'$ output by integrator 30 and/or modulated signal $V_{QUANT}$) within the signal path of amplifier 16 and based at least thereon, perform calibration of audio IC 9. For example, in some embodiments, control system 28 may generate a digital trim signal combined by a combiner 20 with digital audio input signal DIG_IN in order to effectively modify digital audio input signal DIG_IN to correct for detected offset within the amplifier system of audio IC 9. As another example, in these and other embodiments, control system 28 may generate one or more analog trim signals to modify resistances of one or more of input resistors 46, one or more of feedback resistors 48, and/or parameters of integrator 30 (e.g., modify current sources of an operational amplifier of integrator 30, modify external current sources or resistors that apply an external offset to integrator 30, etc.).

Figure 3:
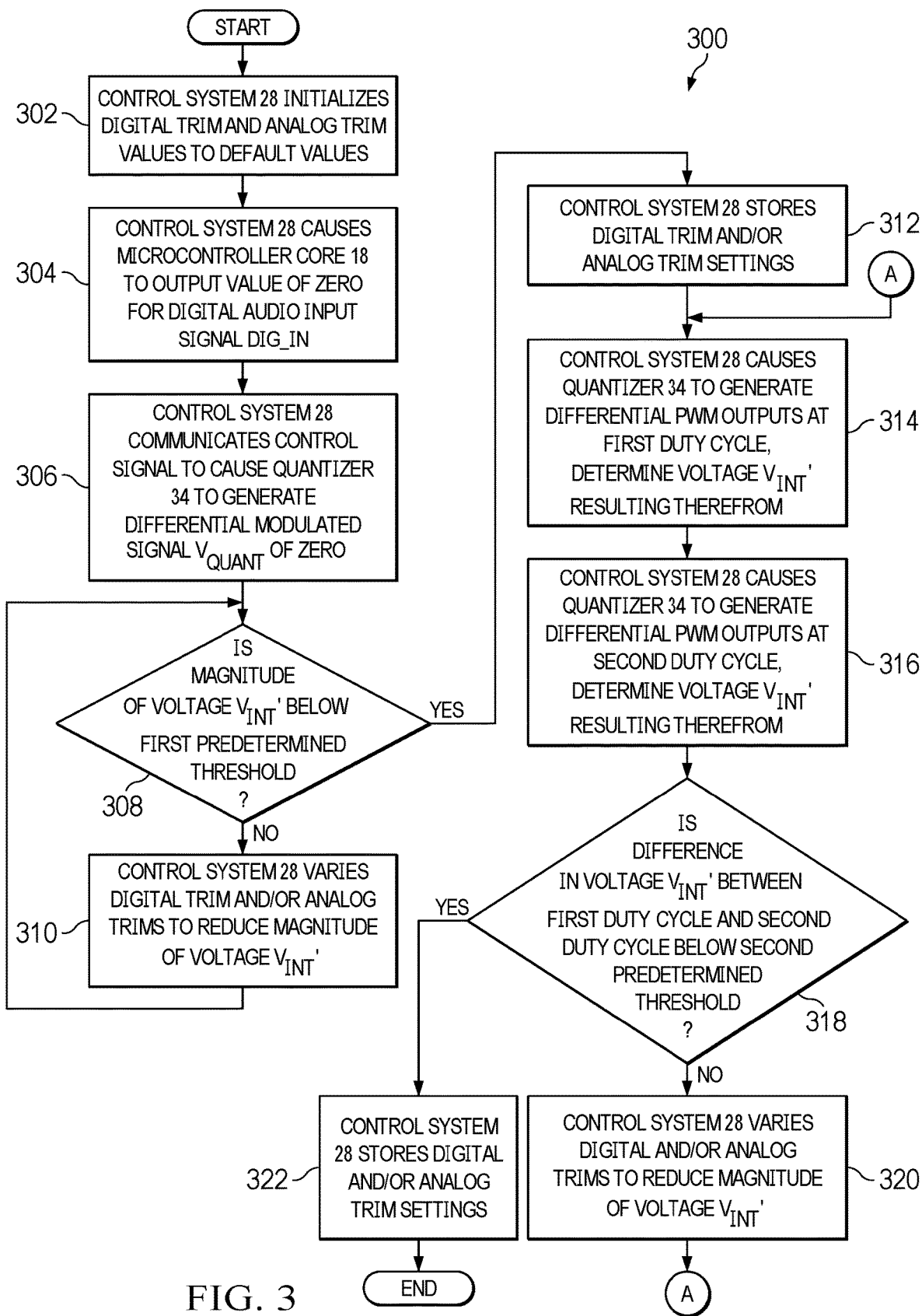
FIG. 3 illustrates a flow chart of an example method for open-loop calibration of the audio integrated circuit depicted in FIG. 2, in accordance with embodiments of the present disclosure.

FIG. 3 illustrates a flow chart of an example method 300 for open-loop calibration of the amplifier system of audio IC 9, in accordance with embodiments of the present disclosure. According to certain embodiments, method 300 may begin at step 302. As noted above, teachings of the present disclosure may be implemented in a variety of configurations of audio IC 9. As such, the preferred initialization point for method 300 and the order of the steps comprising method 300 may depend on the implementation chosen.

At step 302, control system 28 may initialize digital trim and analog trim values to default values. For example, the digital trim value may be set to zero while analog trim values may be set in accordance with a desired nominal gain for amplifier 16. At step 304, control system 28 may communicate a control signal to microcontroller core 18 such that microcontroller core 18 outputs a value of zero for digital audio input signal DIG_IN. At step 306, control system 28 may communicate a control signal to quantizer 34 to cause quantizer 34 to generate a differential modulated signal $V_{QUANT}$ of zero to class-D audio output stage 42 (e.g., by outputting the same square wave signal on each of its differential outputs), regardless of intermediate voltage $V_{INT}$ generated by first stage 22. By doing so, control system 28 during such open-loop calibration mode effectively breaks/opens the signal feedback loop present during normal operation of audio IC 9.

At step 308, control system 28 may determine if a magnitude of voltage $V_{INT}'$ is below a first predetermined threshold. A substantially non-zero value of voltage $V_{INT}'$ may indicate a presence of offset within the signal path of amplifier 16, including without limitation an offset inherent to integrator 30, offset due to mismatches between input resistors 46, and/or offset due to mismatches between feedback resistors 48. Thus, control system 28 may attempt to minimize voltage $V_{INT}'$ during the open-loop calibration mode by varying the digital trim and/or one or more of the analog trims in order to reduce magnitude of voltage $V_{INT}'$ below the first predetermined threshold. Accordingly, if the magnitude of voltage $V_{INT}'$ is below the first predetermined threshold, method 300 may proceed to step 312. Otherwise, method 300 may proceed to step 310.

At step 310, control system 28 may vary the digital trim and/or one or more of the analog trims in an effort to reduce the magnitude of voltage $V_{INT}'$. After completion of step 310, method 300 may proceed again to step 308.

At step 312, control system 28 may store the digital trim and/or analog trim settings in order to recall and apply such trim settings during normal operation of the amplifier system.

While the foregoing steps may detect and correct for an overall offset of the amplifier system, such steps may not isolate any particular source of offset. However, the following steps may isolate offset due to mismatches between input resistors 46 and/or mismatches between feedback resistors 48.

At step 314 (while maintaining digital audio input signal DIG_IN at zero), control system 28 may communicate control signals to quantizer 34 to cause quantizer 34 to generate differential PWM outputs of quantizer 34 at a first duty cycle (e.g., a 25% duty cycle) while maintaining the differential modulated signal $V_{QUANT}$ of quantizer 34 to be zero, and determine voltage $V_{INT}'$ resulting therefrom. At step 316 (while maintaining digital audio input signal DIG_IN at zero), control system 28 may communicate control signals to quantizer 34 to cause quantizer 34 to generate differential PWM outputs of quantizer 34 at a second duty cycle (e.g., a 75% duty cycle) while maintaining the differential modulated signal $V_{QUANT}$ of quantizer 34 to be zero, and determine voltage $V_{INT}'$ resulting therefrom.

Operating at different duty cycles while maintaining the differential modulated signal $V_{QUANT}$ of quantizer 34 at zero may achieve the effect of varying the common-mode voltage of output voltage $V_{OUT}$. Accordingly, at steps 314 and 316, in lieu of varying duty cycles of the differential outputs of quantizer 34, in some embodiments, control system 28 may generate control signals that vary the common mode voltage of output voltage $V_{OUT}$ between two different levels (e.g., by varying a supply voltage to class-D audio output stage 42). The difference between the value of voltage $V_{INT}$' at the first duty cycle/first output common mode voltage and the second duty cycle/second output common mode voltage may be indicative of mismatched resistances between input resistors 46 and/or mismatched resistances between feedback resistors 48.

In some embodiments, instead of operating at two different duty cycles as described above, control system 28 may generate control signals that vary the common mode voltage of output voltage $V_{OUT}$ among at least three different levels (e.g., at least three different duty cycles), determine the differences in voltage $V_{INT}$' at the various duty cycles, and correct for such differences, including correcting for both linear and non-linear mismatches of input resistors 46 and/or both linear and non-linear mismatches of feedback resistors 48.

At step 318, control system 28 may determine if a magnitude of the difference in voltage $V_{INT}$' between the first duty cycle/first output common mode voltage and the second duty cycle/second output common mode voltage is below a second predetermined threshold. If the magnitude of the difference is below the second predetermined threshold, method 300 may proceed to step 322. Otherwise, method 300 may proceed to step 320.

At step 320, control system 28 may vary the digital trim and/or one or more of the analog trims in an effort to reduce the magnitude of voltage $V_{INT}$'. After completion of step 320, method 300 may proceed again to step 314

At step 322, control system 28 may store the digital trim and/or analog trim settings in order to recall and apply such trim settings during normal operation of the amplifier system. After completion of step 322, method 300 may end.

The steps of method 300 may be applied to each gain setting of the amplifier system in order to determine offset and perform calibration for each gain setting.

Although FIG. 3 discloses a particular number of steps to be taken with respect to method 300, it may be executed with greater or fewer steps than those depicted in FIG. 3. In addition, although FIG. 3 discloses a certain order of steps to be taken with respect to method 300, the steps comprising method 300 may be completed in any suitable order. For example, in some embodiments, steps 314-322 used to isolate and calibrate for resistor mismatch may be performed prior to steps 302-312 for determining and calibrating for overall offset.

Method 300 may be implemented using control system 28, components thereof or coupled thereto, or any other system operable to implement method 300. In certain embodiments, method 300 may be implemented partially or fully in software and/or firmware embodied in computer-readable media.

Figure 4:
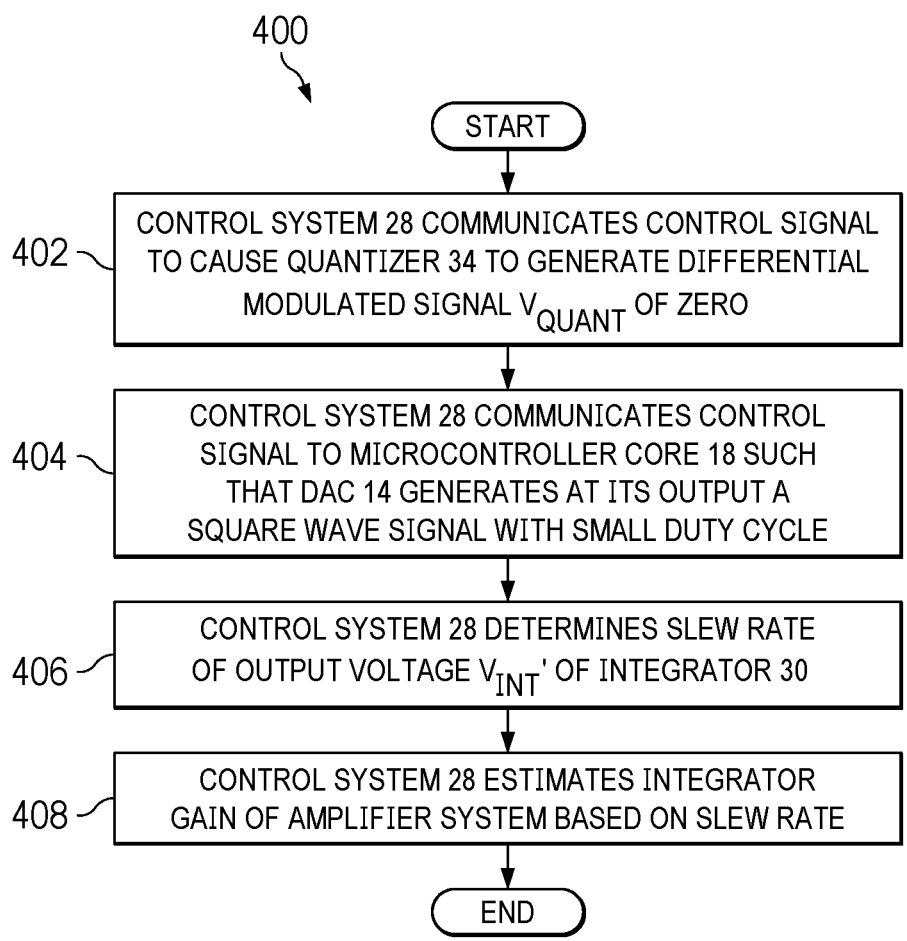
FIG. 4 illustrates a flow chart of an example method for determining a gain of the audio integrated circuit depicted in FIG. 2, in accordance with embodiments of the present disclosure.

FIG. 4 illustrates a flow chart of an example method 400 for determining a gain of the amplifier system of audio IC 9, in accordance with embodiments of the present disclosure. According to certain embodiments, method 400 may begin at step 402. As noted above, teachings of the present disclosure may be implemented in a variety of configurations of audio IC 9. As such, the preferred initialization point for method 400 and the order of the steps comprising method 400 may depend on the implementation chosen.

At step 402, control system 28 may communicate a control signal to quantizer 34 to cause quantizer 34 to generate a differential modulated signal $V_{QUANT}$ of zero to class-D audio output stage 42 (e.g., by outputting the same square wave signal on each of its differential outputs), regardless of intermediate voltage $V_{INT}$ generated by first stage 22. By doing so, control system 28 during such open-loop calibration mode effectively breaks/opens the signal feedback loop present during normal operation of audio IC 9.

At step 404, control system 28 may communicate a control signal to microcontroller core 18 such that microcontroller core 18 outputs a value for digital audio input signal DIG_IN such that DAC 14 generates at its output a square wave signal with a small duty cycle (e.g., a minimum duty cycle possible or the smallest non-zero value for DAC 14). As a result of applying such square wave signal to the input of amplifier 16 in this open-loop configuration, the output voltage $V_{INT}$' generated by integrator 30 may generate a periodic signal between its minimum and maximum values, with a finite slew rate when increasing from its minimum value and its maximum value, and vice versa. In some embodiments, the square wave signal may cause the output of voltage $V_{INT}$' generated by integrator 30 to saturate. In these and other embodiments, the input voltage may be ramped slowly.

At step 406, control system 28 may determine the slew rate of output voltage $V_{INT}$'. At step 408, control system 28 may estimate an integrator gain of the amplifier system based on the slew rate, as the integrator gain from an input (e.g., analog input signal $V_{IN}$) of integrator 30 and the output of integrator 30 (e.g., voltage $V_{INT}$') may be a function of the slope of voltage $V_{INT}$'.

After completion of step 408, method 400 may end.

Although FIG. 4 discloses a particular number of steps to be taken with respect to method 400, it may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using control system 28, components thereof or coupled thereto, or any other system operable to implement method 400. In certain embodiments, method 400 may be implemented partially or fully in software and/or firmware embodied in computer-readable media.

While method 300 breaks or opens the amplifier feedback loop in order to perform calibration, control system 28 may also, in addition to or in lieu of the open-loop calibration of method 300, perform calibration while maintaining the amplifier system in a closed-loop configuration, as described below with reference to method 500.

Figure 5:
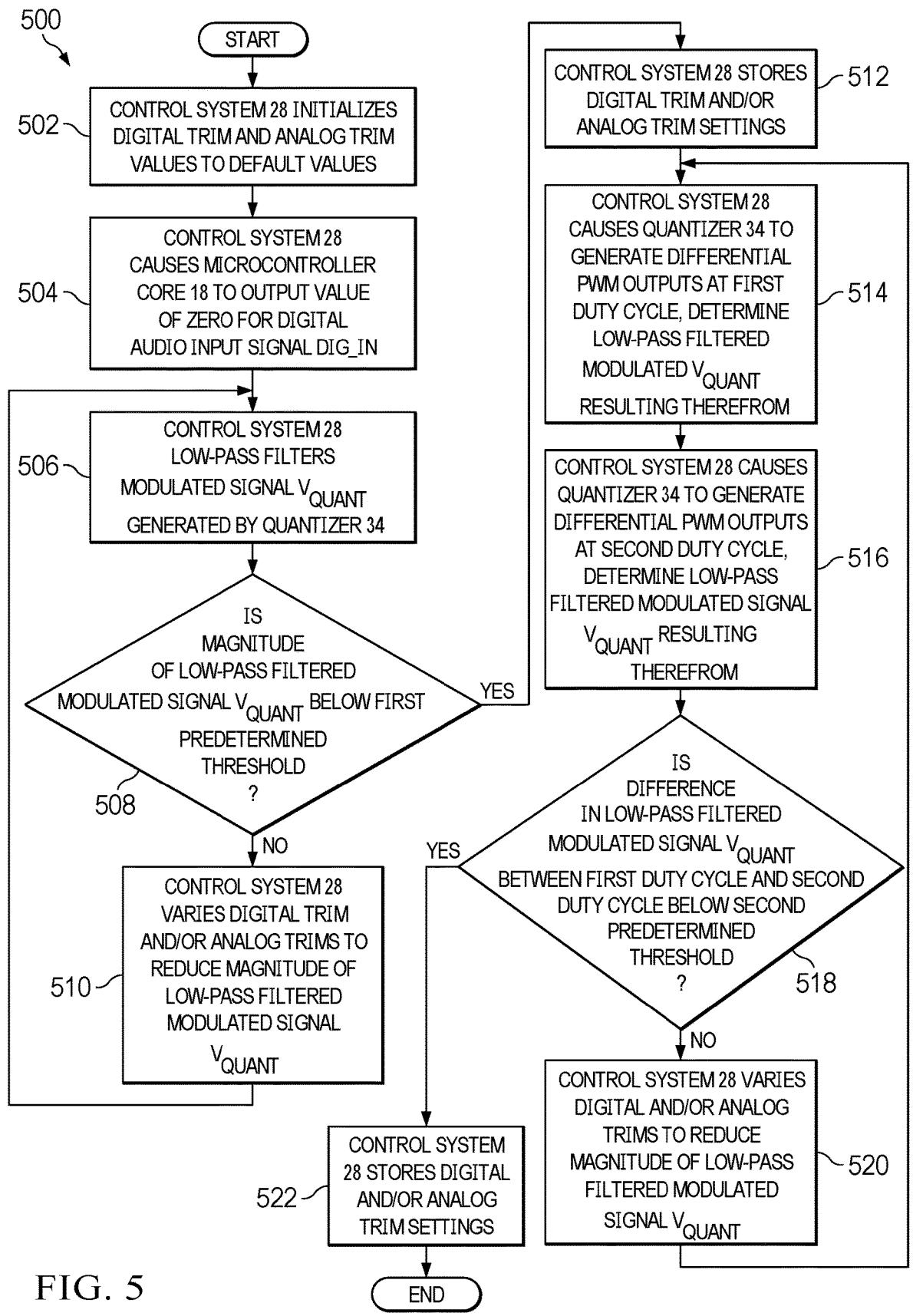
FIG. 5 illustrates a flow chart of an example method for closed-loop calibration of the audio integrated circuit depicted in FIG. 2, in accordance with embodiments of the present disclosure.

FIG. 5 illustrates a flow chart of an example method 500 for closed-loop calibration of the amplifier system of audio IC 9, in accordance with embodiments of the present disclosure. According to certain embodiments, method 500 may begin at step 502. As noted above, teachings of the present disclosure may be implemented in a variety of configurations of audio IC 9. As such, the preferred initialization point for method 500 and the order of the steps comprising method 500 may depend on the implementation chosen.

At step 502, control system 28 may initialize digital trim and analog trim values to default values. For example, the digital trim value may be set to zero while analog trim values may be set in accordance with a desired nominal gain for amplifier 16. At step 504, control system 28 may communicate a control signal to microcontroller core 18 such that microcontroller core 18 outputs a value of zero for digital audio input signal DIG_IN.

At step 506, control system 28 may low-pass filter (e.g., with an averaging filter) modulated signal $V_{QUANT}$ generated by quantizer 34. At step 508, control system 28 may determine if a magnitude of the low-pass filtered modulated signal $V_{QUANT}$ is below a first predetermined threshold. A substantially non-zero value of low-pass filtered modulated signal $V_{QUANT}$ may indicate a presence of offset within the signal path of amplifier 16, including without limitation an offset inherent to integrator 30, offset due to mismatches between input resistors 46, and/or offset due to mismatches between feedback resistors 48. Thus, control system 28 may attempt to minimize low-pass filtered modulated signal $V_{QUANT}$ during the closed-loop calibration mode by varying the digital trim and/or one or more of the analog trims in order to reduce magnitude of low-pass filtered modulated signal $V_{QUANT}$ below the first predetermined threshold. Accordingly, if the magnitude of low-pass filtered modulated signal $V_{QUANT}$ is below the first predetermined threshold, method 500 may proceed to step 512. Otherwise, method 500 may proceed to step 510.

At step 510, control system 28 may vary the digital trim and/or one or more of the analog trims in an effort to reduce the magnitude of low-pass filtered modulated signal $V_{QUANT}$. After completion of step 510, method 500 may proceed again to step 506.

At step 512, control system 28 may store the digital trim and/or analog trim settings in order to recall and apply such trim settings during normal operation of the amplifier system.

While the foregoing steps may detect and correct for an overall offset of the amplifier system, such steps may not isolate any particular source of offset. However, the following steps may isolate offset due to mismatches between input resistors 46 and/or mismatches between feedback resistors 48.

At step 514, control system 28 may communicate control signals to quantizer 34 to cause quantizer 34 to generate differential PWM outputs of quantizer 34 at a first duty cycle (e.g., a 25% duty cycle), and determine low-pass filtered modulated signal $V_{QUANT}$ resulting therefrom. At step 516, control system 28 may communicate control signals to quantizer 34 to cause quantizer 34 to generate differential PWM outputs of quantizer 34 at a second duty cycle (e.g., a 75% duty cycle), and determine low-pass filtered modulated signal $V_{QUANT}$ resulting therefrom.

Operating at different duty cycles while maintaining the differential modulated signal $V_{QUANT}$ of quantizer 34 near zero may achieve the effect of varying the common-mode voltage of output voltage $V_{OUT}$. Accordingly, at steps 514 and 516, in lieu of varying duty cycles of the differential outputs of quantizer 34, in some embodiments, control system 28 may generate control signals that vary the common mode voltage of output voltage $V_{OUT}$ between two different levels (e.g., by varying a supply voltage to class-D audio output stage 42). The difference between the value of differential modulated signal $V_{QUANT}$ at the first duty cycle/first output common mode voltage and the second duty cycle/second output common mode voltage may be indicative of mismatched resistances between input resistors 46 and/or mismatched resistances between feedback resistors 48.

In some embodiments, instead of operating at two different duty cycles as described above, control system 28 may generate control signals that vary the common mode voltage of output voltage $V_{OUT}$ among at least three different levels (e.g., at least three different duty cycles), determine the differences in voltage $V_{INT}'$ at the various duty cycles, and correct for such differences, including correcting for both linear and non-linear mismatches of input resistors 46 and/or both linear and non-linear mismatches of feedback resistors 48.

At step 518, control system 28 may determine if a magnitude of the difference in low-pass filtered modulated signal $V_{QUANT}$ between the first duty cycle/first output common mode voltage and the second duty cycle/second output common mode voltage is below a second predetermined threshold. If the magnitude of the difference is below the second predetermined threshold, method 500 may proceed to step 522. Otherwise, method 500 may proceed to step 520.

At step 520, control system 28 may vary the digital trim and/or one or more of the analog trims in an effort to reduce the magnitude of differential modulated signal $V_{QUANT}$. After completion of step 520, method 500 may proceed again to step 514.

At step 522, control system 28 may store the digital trim and/or analog trim settings in order to recall and apply such trim settings during normal operation of the amplifier system. After completion of step 522, method 500 may end.

The steps of method 500 may be applied to each gain setting of the amplifier system in order to determine offset and perform calibration for each gain setting.

Although FIG. 5 discloses a particular number of steps to be taken with respect to method 500, it may be executed with greater or fewer steps than those depicted in FIG. 5. In addition, although FIG. 5 discloses a certain order of steps to be taken with respect to method 500, the steps comprising method 500 may be completed in any suitable order. For example, in some embodiments, steps 514-522 used to isolate and calibrate for resistor mismatch may be performed prior to steps 502-512 for determining and calibrating for overall offset.

Method 500 may be implemented using control system 28, components thereof or coupled thereto, or any other system operable to implement method 500. In certain embodiments, method 500 may be implemented partially or fully in software and/or firmware embodied in computer-readable media.

The calibration operations performed by control system 28 and described above may be performed at any suitable time, including without limitation during a calibration phase occurring at powering-on of audio IC 9, occurring following assembly of audio IC 9, occurring when the amplifier system of audio IC 9 is not in use (e.g., not generating audio content), and/or occurring in response to a change in temperature proximate to audio IC 9.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A switched mode amplifier system comprising:
   a switched mode amplifier comprising:
      an amplifier input coupled to an output of an analog integrator; and
      an amplifier output; and
   a calibration system configured to:
      force the input of the analog integrator to a fixed known input value;
      determine a slew rate of an analog signal generated at the output of the analog integrator in response to forcing the input of the analog integrator to the fixed value; and
      determine an integrator gain of the switched mode amplifier system based on the slew rate.

2. The switched mode amplifier system of claim 1, wherein the fixed known value is a value that causes the integrator to saturate.

3. The switched mode amplifier system of claim 1, wherein the calibration system is configured to disable feedback of the switched mode amplifier system when determining the slew rate.

4. The switched mode amplifier system of claim 1, further comprising a feedback network coupled between the amplifier output and an input of the analog integrator.

5. The switched mode amplifier system of claim 4, wherein the calibration system disables the feedback network by forcing the amplifier output to a fixed known duty cycle.

6. A method, in a switched mode amplifier system having a switched mode amplifier including an amplifier input coupled to an output of an analog integrator and an amplifier output, the method comprising:
   forcing the input of the analog integrator to a fixed known input value;
   determining a slew rate of an analog signal generated at the output of the analog integrator in response to forcing the input of the analog integrator to the fixed value; and
   determining an integrator gain of the switched mode amplifier system based on the slew rate.

7. The method of claim 6, wherein the fixed known value is a value that causes the integrator to saturate.

8. The method of claim 6, further comprising disabling feedback of the switched mode amplifier system when determining the slew rate.

9. The method of claim 6, the switched mode amplifier system further having a feedback network coupled between the amplifier output and an input of the analog integrator.

10. The method of claim 9, further comprising disabling the feedback network by forcing the amplifier output to a fixed known duty cycle.

11. A calibration system for use with a switched mode amplifier system having a switched mode amplifier including an amplifier input coupled to an output of an analog integrator and an amplifier output and having a feedback network coupled between the amplifier output and an input of the analog integrator, the calibration system configured to:
   force the input of the analog integrator to a fixed known input value;
   determine a slew rate of an analog signal generated at the output of the analog integrator in response to forcing the input of the analog integrator to the fixed value; and
   determine an integrator gain of the switched mode amplifier system based on the slew rate.

12. The calibration system of claim 11, wherein the fixed known value is a value that causes the integrator to saturate.

13. The calibration system of claim 11, wherein the calibration system is configured to disable feedback of the switched mode amplifier system when determining the slew rate.

14. The calibration system of claim 11, the switched mode amplifier system further having a feedback network coupled between the amplifier output and an input of the analog integrator.

15. The calibration system of claim 14, wherein the calibration system disables the feedback network by forcing the amplifier output to a fixed known duty cycle.

* * * * *